United States Patent [19]

Kim et al.

[11] Patent Number: 5,717,354

[45] Date of Patent: Feb. 10, 1998

[54] INPUT PROTECTION CIRCUIT AND METHOD FOR SEMICONDUCTOR MEMORY DEVICE

[75] Inventors: Myung-Jae Kim, Kyungki-do; Do-Chan Choi, Seoul, both of Rep. of Korea

[73] Assignee: Samsung Electronics Co., LTD., Suwon, Rep. of Korea

[21] Appl. No.: 632,591

[22] Filed: Apr. 15, 1996

[30] Foreign Application Priority Data

Apr. 13, 1995 [KR] Rep. of Korea ............... 8686/1995

[51] Int. Cl.$^6$ ............................................. H03K 5/08
[52] U.S. Cl. ........................ 327/309; 327/313; 327/379
[58] Field of Search ............................ 327/50, 78, 81, 327/108, 309, 310, 312, 313, 314, 316, 317, 318, 319, 320, 321, 322, 323, 324, 325, 327, 328, 379

Primary Examiner—Timothy P. Callahan
Assistant Examiner—Jeffrey Zweizig
Attorney, Agent, or Firm—Cushman Darby & Cushman IP Group of Pillsbury Madison & Sutro LLP

[57] ABSTRACT

An input protection circuit for a semiconductor memory device senses when the level of an external input signal drops below a reference voltage corresponding to a predetermined logic level, thereby enabling instant correction. The input protection circuit is interposed between an external power voltage terminal and an input terminal of the input buffer, and the external power voltage is transferred to the input terminal of the input buffer when the level of the external input signal applied to the input terminal drops below the predetermined logic level. The circuit includes an internal reference voltage generator which supplies a voltage having a level corresponding to the predetermined logic level and designed to compensate for a known device offset so that the external input signal applied to the input terminal can be instantly corrected.

12 Claims, 2 Drawing Sheets

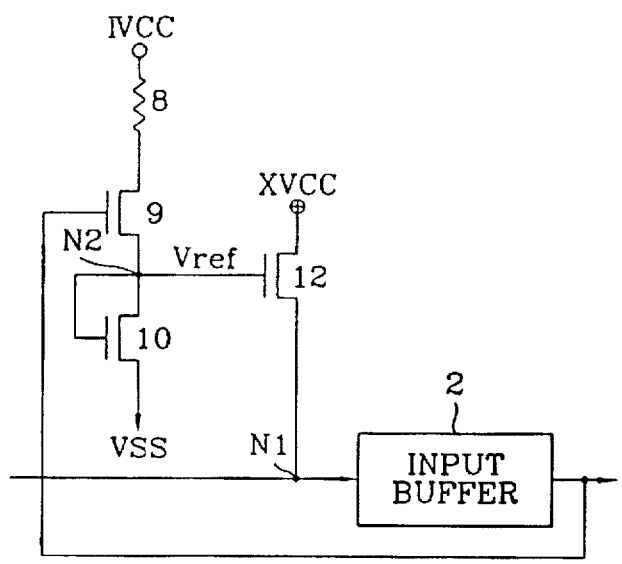
Fig. 4
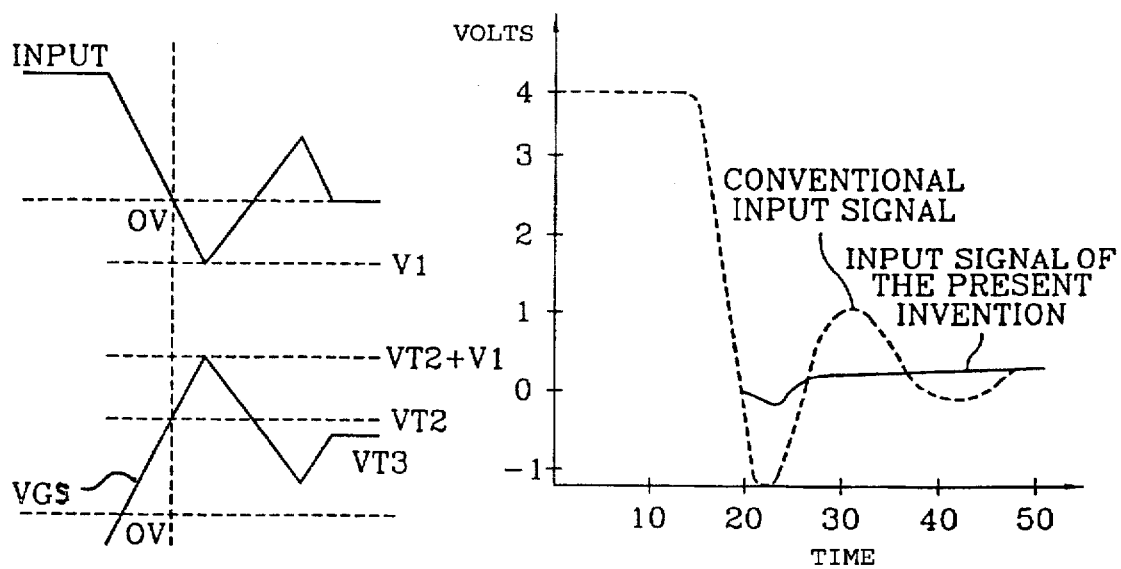
Fig. 5
Fig. 6

INPUT PROTECTION CIRCUIT AND METHOD FOR SEMICONDUCTOR MEMORY DEVICE

BACKGROUND OF THE INVENTION

1. Field of the Invention

The present invention relates to a semiconductor memory device, and more particularly, to an input protection circuit and method for stabilizing an external signal before it is input to the memory. The present application is based upon Korean Application No. 8686/1995, which is incorporated herein by reference.

2. Description of the Related Art

In a semiconductor memory device, it is essential to include an input buffer which buffers the external signals input to the memory and which supplies an adaptable internal signal based thereon to ensure compatibility between signals that are circulated both within and without the memory.

Among input signals produced from a circuit outside the memory, those input signals having a level lower than a reference voltage, for example, a ground voltage, and unstable input signals which exhibit ringing, are particularly likely to cause false operations of the input buffer and delay its operational speed.

Accordingly, in order to prevent such problems, an input protection circuit is provided.

FIGS. 1 and 2 are circuit diagrams of conventional input protection circuits. The input protection circuit of FIG. 1 is composed of a diode 4 connected between a node N1, which, for example, is the input stage of an input buffer 2, and a reference voltage VSS. Another conventional input protection circuit as shown in FIG. 2 is composed of an N-Metal Oxide Semiconductor (NMOS) transistor 6 which is diode-connected between the input buffer's input stage N1 and reference voltage VSS.

The conventional input protection circuits shown in FIGS. 1 and 2 with components stated above, are designed to clamp the voltage level of node N1 so that it does not drop below the reference voltage level. That is, when the voltage level of node N1 connected with diode 4 or NMOS transistor 6 drops below the level of reference voltage VSS, electric charges are supplied from the reference voltage terminal to thereby correct the voltage level of node N1.

However, in order for diode 4 and NMOS transistor 6 to become conductive and carry out their correcting operations in the circuits of FIGS. 1 and 2, the voltage of node N1 must drop lower than a predetermined voltage level. That is, in FIG. 1, the correcting operation is performed only when node N1's voltage is lower than reference voltage VSS by the threshold voltage of diode 4. Likewise, in the circuit of FIG. 2, a voltage difference VGS between node N1 voltage and a gate voltage of NMOS transistor 6 must be greater than the threshold voltage of NMOS transistor 6. For example, where the threshold voltages of diode 4 and NMOS transistor 6 are −0.7V, the correcting operation is performed when the voltage level of node N1 drops below −0.7V. Therefore, when the voltage level input to node N1 is between −0.7 and 0V, the above described correcting operation can not be performed.

SUMMARY OF THE INVENTION

Therefore, it is an object of the present invention to provide a semiconductor memory device which instantly senses when an input voltage level drops below a reference voltage, thereby performing instant correction.

It is another object of the present invention to provide an input protection method of a semiconductor memory device which instantly corrects an input voltage level when it drops below a reference voltage.

To achieve the first and other objects of the present invention, an input protection circuit according to the present invention is formed between a power voltage and an input buffer's input stage. The input protection circuit corrects an input having a first logic level by supplying the power voltage to the input buffer's input stage, when the input has a voltage lower than the established voltage for the first logic level. The circuit includes an internal reference voltage generator which supplies an internal reference level based on the established voltage and designed to compensate for a known device offset. Because the input is compared against this internal reference level, the input can be instantly corrected.

To achieve the second and other objects of the present invention, there is provided an input protection method that corrects an input below that corresponding to a first logic level by supplying a power voltage when a first logic level input to the memory is less than that established for the first logic level.

BRIEF DESCRIPTION OF THE ATTACHED DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, and wherein:

FIG. 4 is a circuit diagram of another embodiment of an input protection circuit of the present invention.

FIG. 5 is a diagram which shows operation characteristics of the present invention.

FIG. 6 is a waveform diagram that shows an input terminal voltage level during operation of the circuits of FIGS. 2 and 4.

DETAILED DESCRIPTION OF PREFERRED EMBODIMENTS

Figure 1:
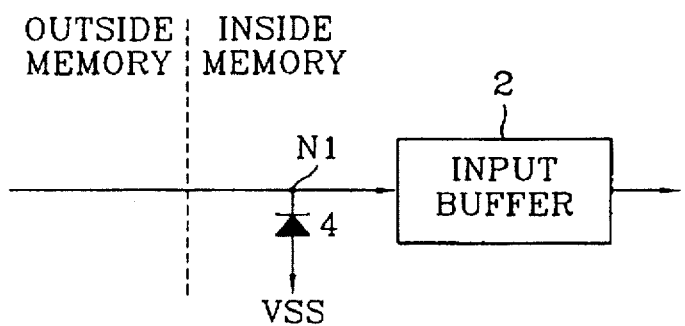
FIG. 1 is a circuit diagram of one example of a conventional input protection circuit.
Figure 2:
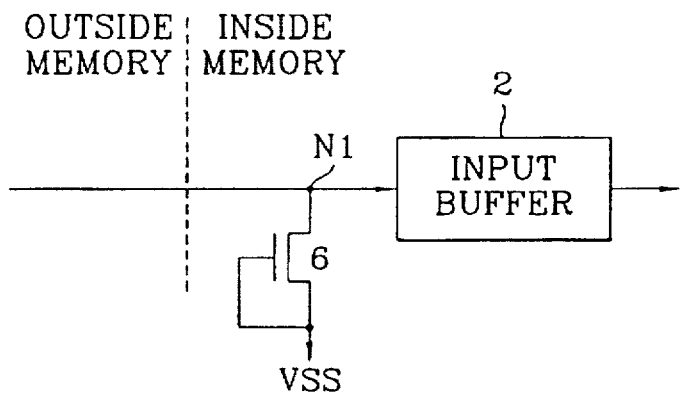
FIG. 2 is a circuit diagram of another example of a conventional input protection circuit.
Figure 3:
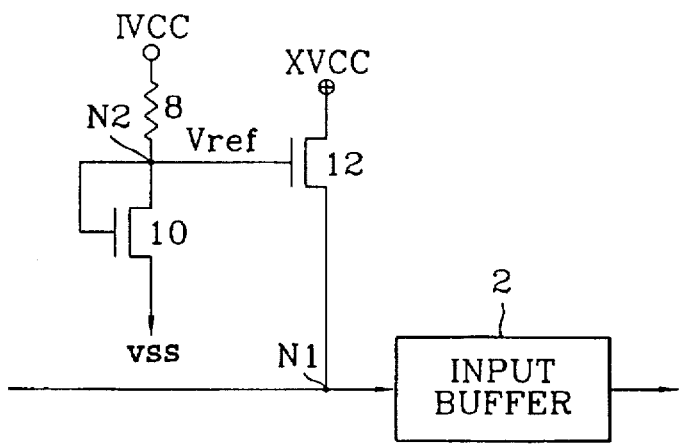
FIG. 3 is a circuit diagram of one embodiment of an input protection circuit of the present invention.

FIG. 3 shows an input protection circuit according to one embodiment of the present invention. As shown in FIG. 3, NMOS transistor 12 is connected between an external power supplying terminal XVCC and an input node N1 of input buffer 2. Resistor 8 and NMOS transistor 10 are connected between internal power voltage IVCC and reference voltage VSS. A gate of NMOS transistor 10 is diode-connected with its drain. Node N2 between series-connected resistor 8 and NMOS transistor 10 is connected with the gate of NMOS transistor 12.

In the input protection circuit having the above stated components, the voltage level of node N2 is determined by the resistance of resistor 8. That is, the circuit is designed so that the voltage at node N2 is always maintained at a certain voltage level. This is chosen such that the voltage applied to node N2 is always higher than a reference voltage VSS (for example, 0V) by exactly the threshold voltage of NMOS transistor 12. Therefore, when a voltage level of node N1 input to the input buffer, corresponding to a first logic input, drops below the established voltage level of 0V, the voltage difference between the source and gate of NMOS transistor 12 becomes higher than the threshold voltage of NMOS transistor 12. Accordingly, NMOS transistor 12 becomes conductive and external supply voltage XVCC is delivered to node N1 through the channel of NMOS transistor 12, so that the negative voltage level of node N1 is corrected. The first logic input stated above means a logic "LOW".

FIG. 4 is a circuit diagram of an input protection circuit according to another embodiment of the present invention. Other than NMOS transistor 9 between series-connected resistor 8 and NMOS transistor 10, this embodiment includes the same components as those in FIG. 3. A gate of NMOS transistor 9 is connected to the output terminal of input buffer 2. NMOS transistor 9 added to the circuit of FIG. 4 receives the input buffer's output terminal signal to thereby control its conductivity.

NMOS transistor 9 is connected as described above so that input protection circuit operates only during an activation state. NMOS transistor 9 becomes non-conductive during a non-activation status, and a voltage is not applied to node N2. Therefore, NMOS transistor 12 does not carry out the above stated correction operation. This reduces current consumption during the non-activation status.

FIG. 5 is a diagram that illustrates the concept of node N1 voltage correction. As shown, when an input voltage falls below 0V, the voltage difference VGS between the source and gate of NMOS transistor 12 shown in FIGS. 3 and 4 becomes higher than the threshold voltage VT2 of the NMOS transistor 12 so that node N1 voltage is corrected.

FIG. 6 is a waveform diagram which compares the node N1 voltage change according to the conventional circuit art and the present invention. As seen in FIG. 6, the input protection circuit of the present invention can correct a sharp voltage drop of node N1. In the conventional circuit, the voltage drop of the input node N1 is corrected by supplying a voltage from the reference voltage. However, the present invention corrects the voltage of node N1 with a voltage higher than the reference voltage. Accordingly, the circuit according to this is capable of making an immediate correction when the node N1 voltage drops to a negative voltage level. Table 1 shows simulation results that verify the effects of an input protection circuit of the present invention.

TABLE 1

|  | PRIOR ART | THE PRESENT INVENTION | DIFFERENCE |
| --- | --- | --- | --- |
| NEGATIVE PEAK LEVEL | -1.40 V | -0.68 V | 0.72 V |
| POSITIVE PEAK LEVEL | 0.46 V | 0.07 V | 0.39 V |

As seen in Table 1, a 0.72V advantage is attained in a negative peak level, and 0.39V at a positive peak level. HSPICE is used for the simulation with XVCC and temperature set to 5V and 25° C., respectively.

As set forth in the foregoing, the input protection circuit according to the present invention realizes a reliable semiconductor memory device which prevents false operations by providing far more stable input signals, as compared to the conventional circuit.

The present invention is based upon Korean Application No. 8686/1995, which is incorporated herein by reference.

Although the present invention has been described herein with reference to the preferred embodiments thereof, those skilled in the art will readily appreciate that various substitutions and modifications can be made thereto without departing from the spirit and scope of the invention as set forth in the appended claims.

What is claimed is:

1. An input protection circuit for a semiconductor memory device having an input buffer which receives an external input signal and which supplies an internal logic signal corresponding to said external input signal, said input protection circuit including:

a reference voltage generator which generates an internal reference voltage having an internal reference level corresponding to a predetermined logic level, said internal reference level compensating for a device offset; and an input level correcting circuit coupled between an external power voltage terminal and an input terminal of said input buffer, said input level correcting circuit receiving said internal reference voltage and applying an external power voltage to said input terminal of said input buffer to maintain said input terminal at said predetermined logic level when said external input signal differs from said internal reference level by at least said device offset.

2. An input protection circuit according to claim 1, wherein said reference voltage generator includes:

a resistor and NMOS transistor coupled in series between an internal power voltage terminal and a reference voltage terminal; and an internal reference voltage node between said resistor and said NMOS transistor, said internal reference voltage being supplied at said internal reference voltage node.

3. An input protection circuit according to claim 1, wherein said input level correcting circuit includes an NMOS transistor having its channel coupled between said external power voltage terminal and said input terminal of said input buffer, said NMOS transistor receiving said internal reference voltage at its gate, said internal reference level differing from said predetermined logic level by an amount corresponding to a threshold voltage of said NMOS transistor.

4. An input protection circuit according to claim 1, further comprising an activation controller which controls whether said internal reference voltage generator provides said internal reference voltage according to an output of said input buffer.

5. An input protection circuit according to claim 2, further comprising a second NMOS transistor having its channel coupled between said resistor and said internal reference voltage node, said second NMOS transistor being controlled by an output of said input buffer.

6. A semiconductor memory device comprising:

an input buffer which receives an external input signal and which supplies an internal logic signal corresponding to said external input signal;

an input protection circuit including:

a reference voltage generator which generates an internal reference voltage having an internal reference level corresponding to a predetermined logic level, said internal reference level compensating for a device offset; and an input level correcting circuit coupled between an external power voltage terminal and an input terminal of said input buffer, said input level correcting circuit receiving said internal reference voltage and applying an external power voltage to said input terminal of said input buffer to maintain said input terminal at said predetermined logic level when said external input signal differs from said internal reference level by at least said device offset.

7. A semiconductor memory device according to claim 6, wherein said reference voltage generator includes:
   a resistor and NMOS transistor coupled in series between an internal power voltage terminal and a reference voltage terminal; and
   an internal reference voltage node between said resistor and said NMOS transistor, said internal reference voltage being supplied at said internal reference voltage node.

8. A semiconductor memory device according to claim 6, wherein said input level correcting circuit includes an NMOS transistor having its channel coupled between said external power voltage terminal and said input terminal of said input buffer, said NMOS transistor receiving said internal reference voltage at its gate, said internal reference level differing from said predetermined logic level by an amount corresponding to a threshold voltage of said NMOS transistor.

9. A semiconductor memory device according to claim 6, wherein said input protection circuit further includes an activation controller which controls whether said internal reference voltage generator provides said internal reference voltage according to an output of said input buffer.

10. An semiconductor memory device according to claim 7, wherein said input protection circuit further includes a second NMOS transistor having its channel coupled between said resistor and said internal reference voltage node, said second NMOS transistor being controlled by an output of said input buffer.

11. A method for protecting an input buffer in a semiconductor memory device, comprising the steps of:
   receiving an external input signal;
   generating a reference voltage level corresponding to a predetermined voltage level, said reference voltage level compensating for a device offset;
   correcting said external input signal to said predetermined voltage level when said external input signal differs from said reference voltage level by at least said device offset; and
   supplying said corrected external input signal as an input to said input buffer.

12. The method according to claim 11, further comprising the steps of:
   determining an activation status according to an output of said input buffer; and
   performing said correcting step according to said activation status.

* * * * *